United States Patent
Ito et al.

(10) Patent No.: US 12,286,568 B2
(45) Date of Patent: Apr. 29, 2025

(54) THERMALLY CONDUCTIVE SILICONE RUBBER SHEET COMPRISING A THERMALLY CONDUCTIVE ADHESIVE LAYER

(71) Applicant: Shin-Etsu Chemical Co., Ltd., Tokyo (JP)

(72) Inventors: Takanori Ito, Annaka (JP); Akihiro Endo, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 908 days.

(21) Appl. No.: 17/428,316

(22) PCT Filed: Feb. 4, 2020

(86) PCT No.: PCT/JP2020/004150
§ 371 (c)(1),
(2) Date: Aug. 4, 2021

(87) PCT Pub. No.: WO2020/162460
PCT Pub. Date: Aug. 13, 2020

(65) Prior Publication Data
US 2022/0127500 A1  Apr. 28, 2022

(30) Foreign Application Priority Data
Feb. 7, 2019 (JP) ................. 2019-020674

(51) Int. Cl.
| | | |
|---|---|---|
| C09J 7/25 | (2018.01) | |
| C09J 7/29 | (2018.01) | |
| C09J 7/35 | (2018.01) | |
| C09J 7/40 | (2018.01) | |
| C09J 11/04 | (2006.01) | |
| C09K 5/14 | (2006.01) | |

(52) U.S. Cl.
CPC .... *C09J 7/35* (2018.01); *C09J 7/25* (2018.01); *C09J 7/29* (2018.01); *C09J 7/401* (2018.01); *C09J 11/04* (2013.01); *C09K 5/14* (2013.01); *C09J 2301/314* (2020.08); *C09J 2301/408* (2020.08); *C09J 2301/41* (2020.08); *C09J 2400/143* (2013.01); *C09J 2467/005* (2013.01); *C09J 2483/00* (2013.01); *C09J 2483/006* (2013.01); *Y10T 428/2848* (2015.01); *Y10T 428/2852* (2015.01)

(58) Field of Classification Search
None
See application file for complete search history.

(56) References Cited

U.S. PATENT DOCUMENTS

| | | | |
|---|---|---|---|
| 4,265,775 A | 5/1981 | Aakalu et al. | |
| 2002/0011660 A1 | 1/2002 | Ebihara et al. | |
| 2010/0006798 A1* | 1/2010 | Endo | C09K 5/14 |
| | | | 252/78.3 |
| 2010/0104865 A1 | 4/2010 | Mizuno et al. | |
| 2012/0040180 A1* | 2/2012 | Husemann | C09J 183/04 |
| | | | 528/33 |
| 2015/0267399 A1* | 9/2015 | Uno | E04B 1/6809 |
| | | | 428/355 R |
| 2019/0316018 A1 | 10/2019 | Ito et al. | |
| 2022/0234335 A1* | 7/2022 | Ishihara | B32B 7/12 |

FOREIGN PATENT DOCUMENTS

| | | | | |
|---|---|---|---|---|
| EP | 2308676 A1 * | 4/2011 | ............ | C08L 83/04 |
| JP | S56161140 A | 12/1981 | | |
| JP | S5736302 B2 | 8/1982 | | |
| JP | H06155517 A | 6/1994 | | |

(Continued)

OTHER PUBLICATIONS

English translation of International Search Report corresponding to International Patent Application No. PCT/JP2020/004150 (3 pages) (mailed Apr. 21, 2020).

*Primary Examiner* — Anish P Desai
(74) *Attorney, Agent, or Firm* — Myers Bigel, P.A.

(57) ABSTRACT

One of the purposes of the present invention is to provide a composite heat-release sheet which is excellent in thermal conductivity and electrical insulation property and, at the same time, has all of sufficient adhesion to an actual machine, low thermal resistance, reworkability, and reliable adhesive strength. Another purpose is to provide a more convenient production process for the heat-release sheet. A thermally conductive silicone rubber sheet comprising at least one thermally conductive silicone rubber layer having a type A durometer hardness of 60 to 96 and at least one silicone adhesive layer, wherein the silicone adhesive layer is a cured product of an addition curable or peroxide curable silicone adhesive composition comprising (a) organopolysiloxane having at least one alkenyl group bonded to a silicon atom and having a phenyl group bonded to a silicon atom in such an amount that the percentage of the number of the phenyl group is 2 to 20%, based on the total number of substituents each bonded to a silicon atom, (c) thermally conductive filler having an average particle diameter of less than 10 μm and containing 0 to 3 mass % of particles having a particle diameter of 20 μm or more and 0 to 0.01 mass % of particles having a particle diameter of 40 μm or more, and (f) silicone resin comprising an $R_3SiO_{1/2}$ unit and an $SiO_{4/2}$ unit.

20 Claims, No Drawings

(56) References Cited

FOREIGN PATENT DOCUMENTS

| | | | |
|---|---|---|---|
| JP | 2001348542 | A | 12/2001 |
| JP | 2006028311 | A | 2/2006 |
| JP | 2008156496 | A | 7/2008 |
| JP | 2009132752 | A | 6/2009 |
| JP | 2009235279 | A | 10/2009 |
| JP | 2014193598 | A | 10/2014 |
| JP | 2016204600 | A | 12/2016 |
| JP | 2018193491 | A | 12/2018 |
| WO | 2014196347 | A1 | 12/2014 |
| WO | 2018070351 | A1 | 4/2018 |

* cited by examiner

THERMALLY CONDUCTIVE SILICONE RUBBER SHEET COMPRISING A THERMALLY CONDUCTIVE ADHESIVE LAYER

TECHNICAL FIELD

The present invention relates to a thermally conductive silicone rubber sheet which is excellent in workability, reworkability, and heat-release properties and is suitable as a heat-releasing, electrical insulation sheet for heat-generating electronic components.

BACKGROUND ART

Heat-generating electronic components such as power transistors and thyristors and integrated circuit elements such as IC, LSI, CPU, and MPU, used for various electronic devices, are positioned in electronic devices so as to smoothly dissipate heat generated from them, because the heat deteriorate their properties and shorten the lifetime of them. In addition, a cooling fin is used to forcibly cool particular parts or the entire device. For integrated circuits, the heat is released to a cooling member, a substrate, or a casing via a heat-releasing sheet (hereinafter called "heat-release sheet").

In recent years, with the progress of integration of electronic devices such as personal computers, a heat amount generated by heat-generating parts or integrated circuit elements in the aforesaid devices increases, so that the conventional forced air cooling systems or heat-release sheets are not always sufficient for cooling these parts or elements or for releasing heat from these parts and elements. In particular, a portable laptop type or notebook type of personal computers requires a cooling method other than the forced air cooling system. With respect to the heat-release sheets, a glass-reinforced epoxy or polyimide resin is used in printed circuit boards carrying the elements, which resin has poor thermal conductivity and, accordingly, the conventional heat-release sheets cannot sufficiently release the heat generated by the elements to a substrate. Therefore, a natural or forced cooling type of heat-release device, such as a fin or a heat pipe, is placed near the elements to transfer heat generated by the elements is transferred to the heat-release device via a heat-release medium.

The heat-release medium is typically a heat-releasing, thermally conductive grease or a heat-releasing sheet having a thickness of about 0.2 to 10.0 mm, which improves the thermal conduction between the elements and the heat-release device. The heat-releasing, thermally conductive grease is, for example, a thermally conductive silicone grease obtained by blending silicone oil with a thermally conductive filler such as silica fiber, zinc oxide or aluminum nitride is known (Patent Literature 1). However, this thermally conductive grease has many inconveniences such as risk of oil bleeding, worsened workability in assembling of electronic components, and generation of voids during thermal history so as to decrease thermal conductivity. A well-known heat-release sheet is such obtained by reinforcing a high-filled, high-hard silicone rubber layer with a cloth-like reinforcing material such as glass fiber cloth (Patent Literature 2). The heat-release sheet of such a type is very useful, because the rubber layer has high hardness and can play both roles of enhancing a thermal conductivity and ensuring electrical insulation properties. However, the heat-release sheet has substantially no surface tackiness so that it is very difficult to implement and fix it to a heat-generating element.

A heat-release sheet is commercially available, which is obtained by providing an adhesive layer on one side or both sides of a high-hard thermally conductive silicone rubber sheet and protecting the surface of the adhesive layer with a releasable protective sheet such as release paper in order to improve the implementing and fixing workability. However, the adhesive layer of such a composite type of heat-release sheet sometimes has an adhesive strength stronger than desirable. When misalignment occurs during implementation, rework may be difficult, or the adhesive layer may break during rework. In the heat-release sheet wherein an adhesive layer is provided on one side or both sides of a high-hard thermally conductive silicone rubber sheet, a component of the silicone adhesive composition migrates into the silicone heat-release rubber sheet with time to reduce the adhesion strength of the surface between the surfaces. It might be thought to have the thickness of the silicone adhesive layer thicker to avoid such a phenomenon. However, this makes the afore-mentioned reworking very difficult and, also, may increase thermal resistance.

Patent Literature 3 discloses a heat-release sheet obtained by layering an acrylic adhesive layer having a higher thermal conductivity than silicone on one side or both sides of a thermally conductive silicone rubber sheet. In a process of its preparation, an acrylic adhesive layer present on a separator is cured, wherein a material for a silicone heat-release rubber sheet is coated and cured. Therefore, preparation steps are complicated and, further, it is difficult to provide a reinforcing material such as glass fiber cloth inside the heat-release rubber sheet for the purpose of improvement of strength. Besides, incorporation of a primer into the acrylic adhesive layer or incorporation of an adhesive component into the material of the silicone heat-release rubber sheet is necessary in order to attain close adhesion between the acrylic adhesive layer and the thermally conductive silicone rubber sheet. However, such components may bleed with time to contaminate an actual machine. Still further, the acrylic adhesive layer has poor heat resistance, so that this is not suited for uses requiring high heat resistance.

Patent Literature 5 discloses a heat-release sheet obtained by putting a low-hard, thermally conductive silicone rubber layer on a high-hard, thermally conductive silicone rubber sheet reinforced with the reinforcing material as described above. It is impossible to attain an overall thickness less than 0.45 mm in this composite type of heat-release sheet due to process restrictions. As a result, though the low-hard, silicone rubber layer itself has a desirable high thermal conductivity, the whole composite sheet inevitably has large thermal resistance due to its large thickness. For a conventional composite heat-release sheet, it is a common practice to obtain layer a high-hard sheet on a low-hard sheet in order to improve the workability of the low-hard sheet. Thus, the conventional sheet is composed of the thick low-hard layer and the thin high-hard layer. In such a constitution, the low-hard layer is compressed and deformed by a pressure, which sometimes makes it difficult to guarantee electrical insulation by securing a space.

Patent Literature 6 discloses a heat-release sheet, wherein a thin, low-hard, slightly-adhesive, and thermally conductive silicone rubber layer is layered, whereby thermal conductivity is improved on account of good contact, and workability and reworkability are also provided on account of the slight adhesion, without sacrificing workability and electric-insulation guarantee. The low-hard silicone rubber layer provides good reworkability, but has the aforesaid slight adhesiveness due to its poor cohesive strength force, which may make it difficult to temporarily fix the heat-release sheet to a heat generation member in some implementation conditions. Patent Literature 6 does not refer to a release force for peeling the sheet off at a peeling rate of 300 mm/min according to the Japanese Industrial Standards (JIS) C 2107 which serves as an important index of an adhesive strength.

PRIOR LITERATURES

Patent Literatures

Patent Literature 1: Japanese Examined Patent Publication No. Sho 57-36302
Patent Literature 2: Japanese Patent Application Laid-Open No. Sho 56-161140
Patent Literature 3: Japanese Patent Application Laid-Open No. 2001-348542
Patent Literature 4: Japanese Patent Application Laid-Open No. 2009-132752
Patent Literature 5: Japanese Patent Application Laid-Open No. Hei 06-155517
Patent Literature 6: Japanese Patent Application Laid-Open No. 2014-193598

SUMMARY OF THE INVENTION

Problems to be Solved by the Invention

As described above, although the conventional high-hard silicone heat-release sheet excellent in not only heat-release properties but also electrical insulation reliability because of its strength, the workability in implementation is bad. When an adhesive layer is provided on one side or both sides of the sheet for improving implementation workability, particularly when a silicone adhesive layer is used, an adhesive component migrates into the silicone heat-release sheet with time to decrease adhesive strength. When an acrylic adhesive layer is used, it is necessary to use a primer component to attain close adhesion to the silicone heat-release sheet, which makes the process complicated. Further, the acrylic adhesive layer has a disadvantage that it is not suited for use requiring high heat resistances.

In a composite sheet comprising a low-hard sheet and a high-hard sheet, its constitution makes it difficult to prepare a thin composite sheet, or to guarantee a space or electrical insulation at a high pressure. In addition, the production process is complicated and a change with time cannot be prevented. Further, the slightly adhesive layer has a poor cohesive force, so that desired adhesion is attained in implementation conditions and temporary fixing of the sheet to an actual machine sometimes is insufficient.

One of the purposes of the present invention is to provide a composite heat-release sheet which is excellent in thermal conductivity and electrical insulation property and, at the same time, has all of sufficient adhesion to an actual machine, low thermal resistance, reworkability, and reliable adhesive strength. Another purpose is to provide a more convenient production process for the heat-release sheet.

Means for Solving the Problems

The present inventors conducted keen researches to solve the aforesaid problems and have found that a thermally conductive silicone rubber sheet comprising a high-hard, thermally conductive silicone rubber layer having a type A durometer hardness of from 60 to 96 and preferably having a thickness of from 50 to 900 μm and, on at least one side of the thermally conductive silicone rubber layer, a silicone adhesive layer having the following specific constitution and preferably having a thickness of from 2 to 40 μm is excellent in thermal conductivity, sufficient adhesive strength, reworkability, and a suppressed change in adhesive strength with time.

That is, the present invention provides a thermally conductive silicone rubber sheet comprising at least one thermally conductive silicone rubber layer having a type A durometer hardness of 60 to 96 and at least one silicone adhesive layer, wherein
  the silicone adhesive layer is a cured product of an addition curable or peroxide curable silicone adhesive composition comprising the following components (a), (c) and (f):
  100 parts by mass of (a) organopolysiloxane having at least one alkenyl group bonded to a silicon atom and having a phenyl group bonded to a silicon atom in such an amount that the percentage of the number of the phenyl group is 2 to 20%, based on the total number of substituents each bonded to a silicon atom,
  100 to 800 parts by mass of (c) thermally conductive filler having an average particle diameter of less than 10 μm and containing 0 to 3 mass % of particles having a particle diameter of 20 μm or more and 0 to 0.01 mass % of particles having a particle diameter of 40 μm or more, and
  50 to 300 parts by mass of (f) silicone resin comprising an $R_3SiO_{1/2}$ unit and an $SiO_{4/2}$ unit, wherein R is an unsubstituted or substituted monovalent hydrocarbon group having from 1 to 10 carbon atoms and no aliphatic unsaturated bond, and a ratio of the number of the $R_3SiO_{1/2}$ unit to the number of the $SiO_{4/2}$ unit is 0.5 to 2.5.

Effects of the Invention

The thermally conductive silicone rubber sheet of the present invention comprises the thermally conductive silicone rubber layer having high hardness, so that it is excellent in workability, electrical insulation guarantee, and thermal conductivity. Further, the thermally conductive silicone rubber sheet comprises a thin silicone adhesive layer having better heat resistance than an acrylic adhesive layer and, thereby, is suited for use even at high temperatures. On account of the silicone adhesive layer in the present invention, the sheet has a suppressed change in adhesive strength with time. The silicone adhesive layer has enhanced thermal conductivity, which decreases thermal resistance of the sheet. The thermally conductive silicone rubber sheet is obtained by directly applying the silicone adhesive composition to the thermally conductive silicone rubber layer and the sheet is formed. Thus, the sheet is prepared in a more convenient process than the conventional layering method using a primer.

DETAILED DESCRIPTION OF THE INVENTION

The present invention will be described below in detail.
[Thermally Conductive Silicone Rubber Layer]
The thermally conductive silicone rubber sheet of the present invention comprises a high-hard, thermally conductive silicone rubber layer having a type A durometer hardness of from 60 to 96. A thermally conductive silicone rubber composition which provides the high-hard, thermally conductive silicone rubber layer is not limited as long as it provides the aforesaid hardness and may be an addition curable thermally conductive silicone rubber composition or a peroxide curable thermally conductive silicone rubber composition. The addition curable silicone rubber composition may comprise an alkenyl group-containing organopolysiloxane, an organohydrogensiloxane, an addition reaction catalyst, a thermally conductive filler and a surface treatment agent. The peroxide curable silicone rubber composition may comprise an alkenyl group-containing organopolysiloxane, an organic peroxide, a thermally conductive filler, and a surface treatment agent. It is noted that a type A durometer hardness may be adjusted by adjusting an amount of the curing agent which will be described below.

Each component will be explained below in detail.

In the addition curable silicone rubber composition and the peroxide curable silicone rubber composition, the alkenyl group-containing organopolysiloxane is represented by an average composition formula: $R^1{}_a SiO_{(4-a)/2}$, wherein $R^1$ is, independently of each other, a substituted or unsubstituted monovalent hydrocarbon group having from 1 to 10, preferably from 1 to 8, carbon atoms and "a" is the number of from 1.90 to 2.05.

$R^1$ is an unsubstituted or substituted monovalent hydrocarbon group having from 1 to 10 carbon atoms, more preferably from 1 to 8 carbon atoms, still more preferably from 1 to 6 carbon atoms. Example of such include alkyl groups, cycloalkyl groups, aryl groups, aralkyl groups, and alkenyl groups; and those groups in which a part or all of the hydrogen atoms are substituted with a halogen atom or a cyano group. Specifically, the examples include alkyl groups such as methyl, ethyl, propyl, butyl, pentyl, hexyl, heptyl, octyl, nonyl, decyl, and octadecyl; cycloalkyl groups such as cyclopentyl and cyclohexyl; aryl group such as phenyl, tolyl, xylyl, and naphthyl; aralkyl groups such as benzyl, phenethyl, and 3-phenylpropyl; haloalkyl groups such as 3,3,3-trifluoropropyl and 3-chloropropyl; and alkenyl groups such as vinyl, allyl, butenyl, pentenyl, and hexenyl. It should be noted that at least one of $R^1$ is an alkenyl group.

The alkenyl group-containing organopolysiloxane preferably has a main chain composed of dimethylsiloxane units or that, further, some of the methyl groups of the aforesaid main chain may be preferably substituted by a vinyl group, a phenyl group, or a 3,3,3-trifluoropropyl group. In addition, the molecular chain terminal of the organopolysiloxane is preferably capped with a triorganosilyl group or a hydroxyl group. Examples of the triorganosilyl group include trimethylsilyl, dimethylvinylsilyl and trivinylsilyl.

The alkenyl group-containing organopolysiloxane preferably has an average polymerization degree in a range of from 20 to 12,000, particularly preferably from 50 to 10,000. The organopolysiloxane may be either in an oil or gum state and the state may be selected, depending on a molding method.

For the addition curable silicone rubber composition, the organopolysiloxane has 2 or more, preferably from 5 to 100, alkenyl groups each bonded to a silicon atom in one molecule. If the content of the alkenyl groups each bonded to a silicon atom is less than the aforesaid lower limit, such a composition does not cured sufficiently. The alkenyl group bonded to a silicon atom is preferably a vinyl group. The alkenyl group may be present at either one or both of the terminal and/or a side chain of the molecular chain. At least one alkenyl group is preferably bonded to a silicon atom at the terminal of the molecular chain.

Examples of the alkenyl group-containing organopolysiloxane in the addition curable silicone rubber composition include copolymers of dimethylsiloxane and methyl vinyl siloxane capped, at both terminals, with a trimethylsiloxy group, methylvinylpolysiloxane capped, at both terminals, with a trimethylsiloxy group, copolymers of dimethylsiloxane methylvinylsiloxane and methylphenylsiloxane capped, at both terminals, with a trimethylsiloxy group, dimethylpolysiloxane capped, at both terminals, with a dimethylvinylsiloxy group, methylvinylpolysiloxane capped, at both terminals, with a dimethylvinylsiloxy group, copolymers of dimethylsiloxane and methylvinylsiloxane capped, at both terminals, with a dimethylvinylsiloxy group, copolymers of dimethylsiloxane, methylvinylsiloxane and methylphenylsiloxane capped, at both terminals, with a dimethylvinylsiloxy group, and dimethylpolysiloxane capped, at both terminals, with a trivinylsiloxy group. They may be used either alone or in combination of two or more.

The addition curable silicone rubber composition further comprises an organohydrogenpolysiloxane having, in one molecule two or more hydrogen atoms, on average, each bonded to a silicon atom, and an addition reaction catalyst. The organohydrogenpolysiloxane reacts with the alkenyl group-containing organopolysiloxane to form a crosslink structure. Examples of the organohydrogenpolysiloxane include methylhydrogenpolysiloxane capped, at both terminals, with a trimethylsiloxy group, copolymers of dimethylsiloxane and methylhydrogensiloxane capped, at both terminals, with a trimethylsiloxy group, copolymers of dimethylsiloxane methylhydrogensiloxane and methylphenylsiloxane capped, at both terminals, with a trimethylsiloxy group, dimethylpolysiloxane capped at both terminals with a dimethylhydrogensiloxy group, copolymers of dimethylsiloxane and methylhydrogensiloxane capped, at both terminals, with a dimethylhydrogensiloxy group, copolymers of dimethylsiloxane and methylphenylsiloxane capped, at both terminals, with a dimethylhydrogensiloxy group, and methylphenylpolysiloxane capped at both terminals with a dimethylhydrogensiloxy group. These organohydrogenpolysiloxanes may be used either alone or in combination of two or more.

The amount of the organohydrogenpolysiloxane may be adjusted, as in conventional addition curable silicone compositions. For example, the amount may be such as to give a ratio of the number of the hydrogen atoms each bonded to a silicon atom to the number of the alkenyl groups each bonded to a silicon atom in the alkenyl group-containing organopolysiloxane is from 0.1 to 4.0, preferably from 0.3 to 2.0. By the reaction within the range, the thermally conductive silicone rubber layer having the afore-mentioned type A durometer A hardness is obtained. If the amount of the organohydrogenpolysiloxane is too small, the silicon rubber composition sometimes fails to cure sufficiently. If the amount is too large on the other hand, a cured product of the silicon rubber composition is very hard, so that many cracks may occur on the surface of the product.

The addition reaction catalyst may be any known catalyst. Examples of the catalyst include platinum-based catalysts such as chloroplatinic acid, alcohol solutions of chloroplatinic acid, platinum-olefin complexes, platinum-alkenylsiloxane complexes, and platinum-carbonyl complexes. The amount of the platinum-based catalyst is not particularly limited and may be an effective amount to promote the addition reaction. For example, the amount of the catalyst may be such as to give a platinum metal amount of from 0.01 to 1,000 ppm, preferably from 0.1 to 500 ppm, based on mass of the alkenyl group-containing organopolysiloxane. If the amount of the catalyst is too small, a silicone rubber composition does not cure sufficiently. On the other hand, the amount of the catalyst is too large, the curing rate of the silicone rubber composition is not further raised sometimes, resulting in economical disadvantage.

Also in the peroxide curable silicone rubber composition, the alkenyl group-containing organopolysiloxane is not particularly limited and preferably has at least two aforesaid alkenyl groups in one molecule. Examples include dimethylpolysiloxane capped, at both terminals, with a dimethylvinylsiloxy group, dimethylpolysiloxane capped, at both terminals, with a methylphenylvinylsiloxy group, copolymers of dimethylsiloxane and methylphenylsiloxane capped at both terminals with a dimethylvinylsiloxy group, copolymers of dimethylsiloxane and methylvinylsiloxane capped, at both terminals, with a dimethylvinylsiloxy group, copolymers of dimethylsiloxane and methylvinylsiloxane capped, at both terminals, with a trimethylsiloxy group, methyl(3,3,3-trifluoropropyl)polysiloxane capped, at both terminals, with a dimethylvinylsiloxy group, copolymers of dimethylsiloxane and methylvinylsiloxane capped, at both terminals, with a silanol group, and copolymers of dimethylsiloxane, methylvinylsiloxane and methylphenylsiloxane capped, at both terminals, with a silanol group. They may be used either alone or in combination of two or more of them.

Examples of the organic peroxide include benzoyl peroxide, dicumyl peroxide, 2,5-dimethyl-2,5-bis(t-butylperoxy)hexane, di-t-butyl peroxide, and t-butyl perbenzoate. They may be used either alone or in combination thereof. The amount of the organic peroxide may usually be from 0.1 to 5 parts by mass, particularly preferably from 0.5 to 3 parts by mass, relative to 100 parts by mass of the alkenyl group-containing organopolysiloxane. Then, the thermally conductive silicone rubber layer having the aforesaid type A durometer hardness is obtained.

Examples of the thermally conductive filler to be contained in the thermally conductive silicone rubber composition include inorganic powders such as aluminum oxide, zinc oxide, silicon oxide, silicon carbide, aluminum nitride, and boron nitride. They may be used either alone or in combination of two or more.

The thermally conductive filler preferably have an average particle diameter of 0.1 μm or more and 50 μm or less, more preferably 1 μm or more and 30 μm or less. It is noted that the average particle diameter herein is based on volume, and determined by a Microtrac particle diameter distribution analyzer MT3300EX (ex. Nikkiso Co., Ltd). When the average particle diameter is larger than the aforesaid upper limit, the sheet may have a rough surface and, consequently, increased thermal resistance.

The amount of the thermally conductive filler in the thermally conductive silicone rubber composition is preferably from 200 to 3,000 parts by mass, more preferably from 400 to 2,000 parts by mass, relative to 100 parts by mass of the aforesaid alkenyl group-containing organopolysiloxane. If the amount of the thermally conductive filler is too small, the silicone rubber layer is likely to have insufficient thermal conductivity. If the amount of the thermally conductive filler is too large, it may be difficult to mix the filler uniformly in the composition and, therefore, molding processability might be worse.

The thermally conductive silicone rubber composition preferably comprises a surface treatment agent. Examples of the surface treatment agent include alkoxysilanes represented by the following general formula (1) and dimethylpolysiloxanes represented by the following general formula (2) and having a trialkoxy group at one terminal. These surface treatment agents may be used either alone or in combination of two or more. The alkoxysilane represented by the following formula (1) and the dimethylpolysiloxane represented by the following formula (2) may be used in combination.

$$R^2_a R^3_b Si(OR^4)_{4-a-b} \qquad (1)$$

wherein $R^2$ is, independently of each other, an alkyl group having from 6 to 15 carbon atoms, $R^3$ is, independently of each other, an unsubstituted or substituted monovalent hydrocarbon group having from 1 to 10 carbon atoms, $R^4$ are, independently of each other, an alkyl group having from 1 to 6 carbon atoms, "a" is an integer of from 1 to 3, and b is an integer of from 0 to 2, with the proviso that a+b is an integer of from 1 to 3.

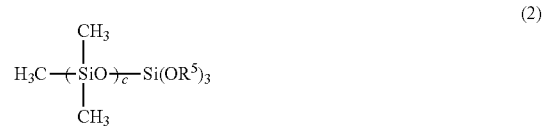

$$(2)$$

wherein $R^5$ is, independently of each other, an alkyl group having 1 to 6 carbon atoms and c is an integer of from 5 to 100, preferably an integer of from 8 to 50.

$R^2$ is an alkyl group having 6 to 15 carbon atoms. When the number of carbon atoms is in the aforesaid range, sufficiently improved wettability and easy handling of the thermally conductive filler are achieved and the resulting composition has improved low-temperature properties. Examples of the alkyl group include hexyl, octyl, nonyl, decyl, dodecyl, and tetradecyl.

$R^3$ is an unsubstituted or substituted monovalent hydrocarbon group having from 1 to 10 carbon atoms. Examples of it include alkyl groups such as methyl, ethyl, propyl, isopropyl, butyl, isobutyl, tert-butyl, pentyl, neopentyl, hexyl, heptyl, octyl, nonyl, decyl, and dodecyl groups; cycloalkyl groups such as cyclopentyl, cyclohexyl, and cycloheptyl; aryl groups such as phenyl, tolyl, xylyl, naphthyl, and biphenylyl; and aralkyl groups such as benzyl, phenylethyl, phenylpropyl, and methylbenzyl groups; and those groups in which a part or all of the hydrogen atoms are substituted with a halogen atom such as fluorine, chlorine, or bromine or a cyano group such as chloromethyl, 2-bromoethyl, 3-chloropropyl, 3,3,3-trifluoropropyl, chlorophenyl, fluorophenyl, cyanoethyl, and 3,3,4,4,5,5,6,6,6-nonafluorohexyl. Preferred are substituted or unsubstituted, monovalent hydrocarbon groups having from 1 to 8 carbon atoms, particularly preferably from 1 to 6 carbon atoms, more preferably from 1 to 3 carbon atoms. More preferred are methyl, ethyl, propyl, chloromethyl, bromoethyl, 3,3,3-trifluoropropyl, cyanoethyl, phenyl, chlorophenyl and fluorophenyl groups.

$R^4$ and $R^5$ are, independently of each other, an alkyl group having from 1 to 6 carbon atoms, such as methyl, ethyl, propyl, isopropyl, butyl, isobutyl, tert-butyl, and pentyl groups, preferably methyl or ethyl group.

Examples of the alkoxysilane represented by the aforesaid formula (1) include the following compounds, and these alkoxysilanes may be used either alone or in combination of two or more.

$C_6H_{13}Si(OCH_3)_3$
$C_{10}H_{21}Si(OCH_3)_3$
$C_{12}H_{25}Si(OCH_3)_3$
$C_{12}H_{25}Si(OC_2H_5)_3$
$C_{10}H_{21}Si(CH_3)(OCH_3)_2$
$C_{10}H_{21}Si(C_6H_5)(OCH_3)_2$
$C_{10}H_{21}Si(CH_3)(OC_2H_5)_2$ $C_{10}H_{21}Si(CH=CH_2)(OCH_3)_2$
$C_{10}H_{21}Si(CH_2CH_2CF_3)(OCH_3)_2$

Examples of the dimethylpolysiloxane represented by the aforesaid formula (2) include the following compounds.

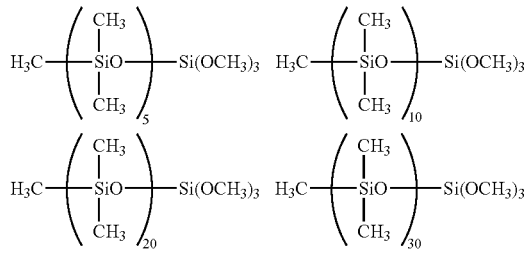

The amount of the surface treatment agent in the thermally conductive silicone rubber composition is preferably from 5 to 80 parts by mass, more preferably from 10 to 75 parts by mass, more preferably from 10 to 50 parts by mass, relative to 100 parts by mass of the alkenyl group-containing organopolysiloxane. If the amount of the surface treatment agent is too large, the surface treatment agent may bleed with time to contaminate an actual machine. If the amount is too small, the thermally conductive filler cannot be incorporated into the thermally conductive silicone rubber composition sometimes.

The thermally conductive silicone rubber composition may comprise another additive as long as the purposes of the present invention are not detracted. Examples of the another additive include reinforcing silica such as fumed silica and precipitated silica, plasticizers such as silicone oil and silicone wetter, flame retardants such as platinum, titanium oxide, and benzotriazole; acetylene type addition reaction controlling agents such as 1-ethynyl-1-cyclohexanol; colorants such as organic pigment and inorganic pigment; heat resistance improvers such as iron oxide and cerium oxide; internal release agents; and solvents such as toluene.

[Preparation of High-Hard, Thermally Conductive Silicone Rubber Layer]

A high-hard, thermally conductive silicone rubber layer is obtained by heat curing the thermally conductive silicone rubber composition to provide high hardness. The thermally conductive silicone rubber layer in the present invention has a type A durometer hardness of from 60 to 96, preferably from 80 to 96. This high hardness is achieved by mixing the aforesaid components in the aforesaid blending ratios, particularly, by setting the amount of the curing agent within the afore-mentioned range. If the hardness is less than the aforesaid lower limit, the surface of the rubber layer is easily scratched in handling; fusion bonding may occur between the surfaces of the rubber layer in continuous taking-up in a form of roll; and a space cannot be guaranteed easily. If the hardness is higher than the aforesaid upper limit, the resulting sheet has poor flexibility, so that a folded sheet may have cracks. It is noted that the hardness of the silicone rubber layer in the present invention is determined on a pile of two cured compositions each having a thickness of 6 mm at 25° C. by a Type A durometer hardness tester.

The thermally conductive silicone rubber layer of the present invention may include comprise a glass fiber cloth or polyimide as an intermediate reinforcing layer. Even in such a case, the hardness of the thermally conductive silicone rubber layer is determined on a cured product not having the intermediate reinforcing layer.

In the thermally conductive silicone rubber sheet of the present invention, the thickness of the thermally conductive silicone rubber layer is preferably 50 μm or more and 900 μm or less, more preferably 60 μm or more and 700 μm or less. As described above, if the high-hard, thermally conductive silicone rubber layer is thinner, the thermally conductive filler included therein protrudes from the surface to damage the smoothness of the coated surface, and make it difficult to layer a silicone adhesive layer (described below) on the surface of the thermally conductive silicone rubber sheet.

The thermally conductive silicone rubber layer preferably has a thermal conductivity of 1.0 W/m·K or more, more preferably 1.2 W/m·K or more. If the thermal conductivity is less than 1.0 W/m·K, the resulting layer may have insufficient thermal conduction properties.

The thermally conductive silicone rubber layer in the present invention may comprise a glass fiber cloth or polyimide as an intermediate reinforcing layer in order to have enhance an improved strength. When the glass fiber cloth is used as an intermediate layer, the glass fiber should be filled, as will be described below. The glass fiber cloth preferably has a thickness of 30 μm or more and 50 μm or less and has weight of 30 g/m² or less. More preferably, it has a thickness of 30 μm or more and 45 μm or less and weight of 25 g/m² or less. The glass fiber cloth has a relatively low thermal conductivity, so that a small thinness is preferred for better thermal conductivity. However, an excessively thin glass fiber cloth has small strength so as to be easily broken and is difficult in shaping.

A thermally conductive silicone resin used for filling the glass fiber cloth preferably has preferably a thermal conductivity of 1.0 W/m·K or more. If the thermal conductivity is less than 1.0 W/m·K, the glass fiber cloth filed therewith has worse thermal conductivity to worsen the thermal conductivity of the whole thermally conductive silicone rubber sheet. The thermally conductive silicon resin for the filling may be same as the afore-mentioned thermally conductive silicone rubber composition. The thickness after filled is preferably 100 μm or less, more preferably 90 μm or less. If the filled glass fiber cloth has a thickness of more than 100 μm, the proportion of the thickness of the highly thermally conductive silicone rubber layer in the whole thickness of the thermally conductive silicone rubber sheet is small, which is disadvantageous in term of the overall thermal conductivity.

The thermally conductive silicone rubber layer in the present invention is preferably non-adhesive. The term "non-adhesive" as used in the present invention means that the silicone rubber layer has an adhesive strength of 0.01 N/25 m or less, particularly below the detection limit or less. When the thermally conductive silicone rubber layer in the present invention has a type A durometer hardness of approximately 90, the thermally conductive silicone rubber layer loses surface tackiness, has the adhesive strength as described above, and is so-called non-adhesive.

[Silicone Adhesive Layer]

The thermally conductive silicone rubber sheet of the present invention comprises at least one thermally conductive silicone rubber layer and at least one silicone adhesive layer layered on the former. The silicone adhesive layer is a cured product of an addition curable or peroxide curable silicone adhesive composition characterized by comprising the following component (a), component (c), and component (f):

100 parts by mass of (a) organopolysiloxane having at least one alkenyl group bonded to a silicon atom and having phenyl groups each bonded to a silicon atom in such an amount that the percentage of the number of the phenyl group is 2 to 20%, based on the total number of substituents each bonded to a silicon atom, 100 to 800 parts by mass of (c) thermally conductive filler having an average particle diameter of less than 10 μm and containing 0 to 3 mass % of particles having a particle diameter of 20 μm or more and 0 to 0.01 mass % of particles having a particle diameter of 40 μm or more, and 50 to 300 parts by mass of (f) silicone resin comprising an $R_3SiO_{1/2}$ unit and an $SiO_{4/2}$ unit, wherein R is an unsubstituted or substituted monovalent hydrocarbon group having from 1 to 10 carbon atoms and no aliphatic unsaturated bond, and a ratio of the number of the $R_3SiO_{1/2}$ unit to the number of the $SiO_{4/2}$ unit is 0.5 to 2.5.

The silicone adhesive composition may be either an addition curable or peroxide curable.

The addition curable silicone adhesive composition preferably comprises the following components:

100 parts by mass of (a) organopolysiloxane having at least one alkenyl group bonded to a silicon atom and having phenyl groups each bonded to a silicon atom in such an amount that the percentage of the number of the phenyl group is 2 to 20%, based on the total number of substituents each bonded to a silicon atom, 100 to 800 parts by mass of (c) thermally conductive filler having an average particle diameter of less than 10 μm and containing 0 to 3 mass % of particles having a particle diameter of 20 μm or more and 0 to 0.01 mass % of particles having a particle diameter of 40 μm or more, (b) organohydrogenpolysiloxane in such an amount that a ratio of the number of the hydrogen atom bonded to a silicon atom in component (b) to the number of the alkenyl group in component (a) is 0.5 to 50, a catalytic amount of (d) addition reaction catalyst, 0.01 to 1 part by mass of (e) addition reaction controlling agent, and 50 to 300 parts by mass of (f) silicone resin comprising an $R_3SiO_{1/2}$ unit and an $SiO_{4/2}$ unit, wherein R is an unsubstituted or substituted monovalent hydrocarbon group having from 1 to 10 carbon atoms and no aliphatic unsaturated bond, and a ratio of the number of the $R_3SiO_{1/2}$ unit to the number of the $SiO_{4/2}$ unit is 0.5 to 2.5.

The peroxide curable silicone adhesive composition preferably comprises the following components:

100 parts by mass of (a) organopolysiloxane having at least one alkenyl group bonded to a silicon atom and having phenyl groups each bonded to a silicon atom in such an amount that the percentage of the number of the phenyl group is 2 to 20%, based on the total number of substituents each bonded to a silicon atom, 100 to 800 parts by mass of (c) thermally conductive filler having an average particle diameter of less than 10 μm and containing 0 to 3 mass % of particles having a particle diameter of 20 μm or more and 0 to 0.01 mass % of particles having a particle diameter of 40 μm or more, 50 to 300 parts by mass of (f) silicone resin comprising an $R_3SiO_{1/2}$ unit and an $SiO_{4/2}$ unit, wherein R is an unsubstituted or substituted monovalent hydrocarbon group having from 1 to 10 carbon atoms and no aliphatic unsaturated bond, and a ratio of the number of the $R_3SiO_{1/2}$ unit to the number of the $SiO_{4/2}$ unit is 0.5 to 2.5, and 0.01 to 10 parts by mass of (g) organic peroxide, relative to 100 parts by mass of component (a).

Each of the components will hereinafter be described in more detail.

[(a) Alkenyl Group-Containing Organopolysiloxane]

Component (a) is an organopolysiloxane having, in one molecule, at least one, preferably 2 or more, alkenyl groups each bonded to a silicon atom. The organopolysiloxane usually has a main chain composed basically of repeating diorganosiloxane units, but may contain a branched structure in a portion of its molecular structure or may have a ring form. A linear diorganopolysiloxane is particularly preferred from the standpoint of the physical properties of a cured product such as mechanical strength. The organopolysiloxane preferably has a kinematic viscosity at 25° C. of from 100 to 50000 $mm^2$/s, more preferably from 1,000 to 30,000 $mm^2$/s. The viscosity is determined by an Ostwald viscometer.

The present invention is characterized in that component (a) has a phenyl group bonded to a silicon atom in such an amount that the percentage of the number of the phenyl group bonded to a silicon atom is from 2 to 20%, based on the total number of substituents each bonded to a silicon atom. The phenyl group percentage is preferably from 4 to 18%, more preferably from 7 to 15%. If the phenyl group percentage is less than the aforesaid lower limit, the adhesive strength may decrease with time after the silicone adhesive layer is layered on the thermally conductive silicone rubber layer. If the phenyl-group percentage is larger than the aforesaid upper limit, both of the initial and adhesive strength of the silicone adhesive layer may decrease very, which is not preferred. The substituents each bonded to a silicon atom are a phenyl group, an alkenyl group, and at other substituents.

The alkenyl group preferably has 2 to 8 carbon atoms, such as vinyl, allyl, propenyl, isopropenyl, butenyl, hexenyl, and cyclohexenyl group. Among these, lower alkenyl groups such as vinyl and allyl groups are preferred, and a vinyl group is particularly preferred.

The other substituent each bonded to a silicon atom other than an alkenyl group and a phenyl group may be a general organic group bonding to a silicon atom of an alkenyl group-containing organopolysiloxane. It is preferably an unsubstituted or substituted, monovalent hydrocarbon group having from 1 to 10 carbon atoms, more preferably from 1 to 6 carbon atoms, still more preferably from 1 to 3 carbon atoms, such as alkyl groups, cycloalkyl groups, aryl groups, and aralkyl groups, and those groups in which a part or all of the hydrogen atoms are substituted with a halogen atom or a cyano group. Specifically, examples of the substituent include alkyl groups such as methyl, ethyl, propyl, isopropyl, butyl, isobutyl, tert-butyl, pentyl, neopentyl, hexyl, heptyl, octyl, nonyl, decyl, and dodecyl groups; cycloalkyl groups such as cyclopentyl, cyclohexyl, and cycloheptyl groups; aryl groups such as tolyl, xylyl, naphthyl, and biphenylyl groups; and aralkyl groups such as benzyl, phenylethyl, phenylpropyl, and methylbenzyl groups; and those groups in which a part or all of the hydrogen atoms are substituted with a halogen atom such as fluorine, chlorine or bromine, or a cyano group, such as chloromethyl, 2-bromoethyl, 3-chloropropyl, 3,3,3-trifluoropropyl, chlorophenyl, fluorophenyl, cyanoethyl, and 3,3,4,4,5,5,6,6,6-nonafluorohexyl groups. Particularly preferred are methyl, ethyl, propyl, chloromethyl, bromoethyl, 3,3,3-trifluoropropyl, cyanoethyl, chlorophenyl and fluorophenyl groups. All of the functional groups other than the alkenyl group bonded to a silicon atom need not to be same.

[(b) Organohydrogenpolysiloxane]

Component (b) is an organohydrogenpolysiloxane and preferably has, in one molecule, 2 or more on average, preferably from 2 to 100, hydrogen atoms directly bonded to a silicon atom (i.e., Si—H). Component (b) functions as a crosslinking agent for component (a). A hydrosilylation reaction between the Si—H group in component (b) and the alkenyl group in component (a) provides a three-dimensional network structure having a crosslinking structure. If the number of the Si—H group is less than 1 on average, curing may not occur. The organohydrogenpolysiloxane may be a conventional compound. It may be represented, for example, by the following general formula (3):

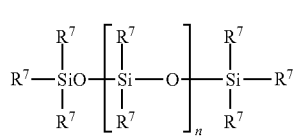

(3)

wherein $R^7$ is, independently of each other, a hydrogen atom or an unsubstituted or substituted monovalent hydrocarbon group having from 1 to 10 carbon atoms and no aliphatic unsaturated bond, with the proviso that at least two of $R^7$ are a hydrogen atom, n is an integer of 1 or more, preferably from 1 to 100, more preferably from 5 to 50.

For $R^7$, examples of the unsubstituted or substituted monovalent hydrocarbon group having 1 to 10 carbon atoms, preferably 1 to 6 carbon atoms, more preferably 1 to 3 carbon atoms, and no aliphatic unsaturated bond include alkyl groups such as methyl, ethyl, propyl, isopropyl, butyl, isobutyl, tert-butyl, pentyl, neopentyl, hexyl, heptyl, octyl, nonyl, decyl, and dodecyl groups; cycloalkyl groups such as cyclopentyl, cyclohexyl, and cycloheptyl groups; aryl groups such as phenyl, tolyl, xylyl, naphthyl, and biphenylyl groups; and aralkyl groups such as benzyl, phenylethyl, phenylpropyl, and methylbenzyl groups; and those groups in which a part or all of the hydrogen atoms are substituted with a halogen atom such as fluorine, chlorine or bromine, or a cyano group, such as chloromethyl, 2-bromoethyl, 3-chloropropyl, 3,3,3-trifluoropropyl, chlorophenyl, fluorophenyl, cyanoethyl, and 3,3,4,4,5,5,6,6,6-nonafluorohexyl groups. Among these, more preferred are methyl, ethyl, propyl, chloromethyl, bromoethyl, 3,3,3-trifluoropropyl, cyanoethyl, phenyl, chlorophenyl and fluorophenyl groups. A preferably of $R^7$ may be same as or different from each other, but at least two of $R^7$ are a hydrogen atom.

The amount of component (b) is in such that a ratio of the number of the hydrogen atoms each bonded to a silicon atom in component (b) to the number of the alkenyl groups in component (a) is 0.1 to 30, preferably from 0.5 to 15, more preferably from 1.0 to 5. If the ratio is less than the aforesaid lower limit, the adhesive layer does not cure sufficiently, leading to worse reworkability. If the ratio is larger than the aforesaid upper limit, the flexibility of the cured product is much worse and adhesive strengths significantly lower, which is not preferred.

[(c) Thermally Conductive Filler]

The thermally conductive filler contained in the silicone adhesive composition is characterized by having an average particle diameter of less than 10 μm and containing from 0 to 3 mass % of particles having a particle diameter of 20 μm or more and from 0 to 0.01 mass % of particles having a particle diameter of 40 μm or more. If the particle diameter is not within the aforesaid range, the thermally conductive adhesive layer does not have a smooth surface and cannot be in close contact with a substance, so that a desired adhesive strength is not be achieved and thermal resistance increases inevitably. The average particle diameter is preferably from 1 to 10 μm, more preferably from 1 to 5 μm. The average particle diameter in the present invention is a value (based on volume) determined by Microtrac MT3300EX (Nikkiso Co., Ltd.) which is a laser diffraction scattering type particle diameter distribution analyzer. When two or more thermally conductive fillers are used in combination, the thermally conductive fillers may independently satisfy the aforesaid particle diameter requirements.

The amount of the particles having a particle diameter of 20 μm or more and the particles having a particle diameter of 40 μm or more in the thermally conductive filler (c) are determined in the following manner.

Ten grams of the filling are put in a proper amount of water and ultrasonically dispersed. A sieve having an opening size of 20 μm another a sieve having an opening size of 40 μm are set on a sieve shaker and, the dispersion of the thermally conductive filler is fed to the shaker. The filler which remains on each of the sieves is dried and weighed.

The thermally conductive filler may be, for example, at least one selected from alumina, aluminum hydroxide, aluminum nitride, boron nitride, zinc oxide, and metal aluminum. Alumina is particularly preferred in view of overall consideration of thermal conductivity, electric insulation and price.

The amount of component (c) is from 100 to 800 parts by mass, preferably from 200 to 500 parts by mass, per 100 parts by mass of component (a). If the amount is less than the aforesaid lower limit, sufficient thermal conductivity cannot be given to the adhesive layer. If the amount is larger than the aforesaid upper limit, the filler is too dense, so that a smooth surface is not attained in a thermally conductive sheet coated with the resulting composition and thermal resistance is larger and adhesive strength is lower.

[(d) Addition Reaction Catalyst]

Component (d) is an addition reaction catalyst and is not limited as long as it promotes an addition reaction between the alkenyl group of component (a) and the Si—H group of component (b). The catalyst may be a known catalyst for hydrosilylation, such as platinum group metal catalyst. Examples of the platinum group metal catalyst include elemental platinum group metals such as platinum, including platinum black, rhodium and palladium; platinum chloride, chloroplatinic acid, and chloroplatinates such as $H_2PtCl_4 \cdot nH_2O$, $H_2PtCl_6 \cdot nH_2O$, $NaHPtCl_6 \cdot nH_2O$, $KaHPtCl_6 \cdot nH_2O$, $Na_2PtCl_6 \cdot nH_2O$, $K_2PtCl_4 \cdot nH_2O$, $PtCl_4 \cdot nH_2O$, $PtCl_2$, and $Na_2HPtCl_4 \cdot nH_2O$, wherein n is an integer of from 0 to 6, preferably 0 or 6; an alcohol-modified chloroplatinic acid (see U.S. Pat. No. 3,220,972); a complex of chloroplatinic acid with an olefin (see U.S. Pat. Nos. 3,159,601, 3,159,662, and 3,775,452); a platinum group metal such as platinum black and palladium, supported on a carrier such as alumina, silica and carbon; a rhodium-olefin complex; chlorotris(triphenylphosphine) rhodium (Wilkinson catalyst); and a complex of platinum chloride, chloroplatinic acid or chloroplatinate with siloxane having a vinyl group, in particular vinyl group-containing cyclic siloxane. The amount of component (d) may be a so-called catalytic amount, usually from about 0.1 to 2000 ppm, relative to the mass of component (a).

[(e) Addition Reaction Controlling Agent]

Component (e) may be a known addition reaction controlling agent used for common addition curable silicone compositions, but is not limited to these. Examples of the addition reaction controlling agent include acetylene compounds such as 1-ethynyl-1-hexanol, 3-butyn-1-ol, and ethynyl methylidene carbinol, various nitrogen compounds, organophosphorus compounds, oxime compounds, and organic chloro compounds. The amount is desirably from about 0.01 to 1 part by mass, per 100 parts by mass of component (a).

[(f) Silicone Resin]

The silicone resin (f) is added in order to give the silicone adhesive composition cohesiveness. A silicone rubber sheet comprising the following specific amount of component (f) has a moderate adhesive strength and excellent reworkability. The silicone resin is a copolymer composed of an $R_3SiO_{1/2}$ unit (M unit) and an $SiO_{4/2}$ unit (Q unit). A molar ratio of M unit to Q unit is 0.5 to 2.5, preferably from 0.6 to 1.4, more preferably from 0.7 to 1.3. If the M/Q is less than 0.5, or larger than 1.5, the composition does not have a desired cohesive strength.

R is an unsubstituted or substituted monovalent hydrocarbon group having 1 to 10 carbon atoms and having no aliphatic unsaturated group. Examples of the unsubstituted or substituted monovalent hydrocarbon group include alkyl groups such as methyl, ethyl, propyl, isopropyl, butyl, isobutyl, tert-butyl, pentyl, neopentyl, hexyl, heptyl, octyl, nonyl, decyl, and dodecyl groups; cycloalkyl groups such as cyclopentyl, cyclohexyl, and cycloheptyl groups; aryl groups such as phenyl, tolyl, xylyl, naphthyl, and biphenylyl groups; and aralkyl groups such as benzyl, phenylethyl, phenylpropyl, and methylbenzyl groups; and those groups in which a part or all of the hydrogen atoms are substituted with a halogen atom such as fluorine, chlorine or bromine, or a cyano group, such as chloromethyl, 2-bromoethyl, 3-chloropropyl, 3,3,3-trifluoropropyl, chlorophenyl, fluorophenyl, cyanoethyl, and 3,3,4,4,5,5,6,6-nonafluorohexyl. Preferred is the monovalent hydrocarbon group having 1 to 6 carbon atoms, more preferably having 1 to 3 carbon atoms. Among these, more preferred are methyl, ethyl, propyl, chloromethyl, bromoethyl, 3,3,3-trifluoropropyl, cyanoethyl, phenyl, chlorophenyl and fluorophenyl groups. R may be same as or different from each other, and is desirably same as one selected for $R^1$. In particular, as described for $R^1$, all of the R are preferably a methyl group in view of costs, availability, chemical stability and environmental burden, unless any special property such as solvent resistance is required.

The amount of component (f) is 50 to 300 parts by mass, preferably 60 to 250 parts by mass, more preferably 60 to 200 parts by mass, still more preferably 70 to 150 parts by mass, per 100 parts by mass of component (a). If the amount of component (f) is less than the aforesaid lower limit, cohesive strength is lower and, therefore, adhesive strength may be lower. If the amount is more than the aforesaid upper limit, adhesive strength may be too large, so that reworking on an actual machine may be difficult. Component (f) itself is solid or viscous liquid at room temperature, but may be dissolved in a solvent. In the latter case, the amount of component (f) to be added to the composition does not include the amount of a solvent. The solvent may be toluene or xylene.

[(g) Organic Peroxide]

Component (g) is an organic peroxide that decomposes in particular conditions to generate free radicals. The organic peroxides may be used alone or in combination of two or more. Examples of the organic peroxide include peroxyketals such as 1,1-di(t-butylperoxy)cyclohexane and 2,2-di(4,4-di-(t-butylperoxy)cyclohexyl)propane; hydroperoxides such as p-menthane hydroperoxide and diisopropylbenzene hydroperoxide; dialkyl peroxides such as dicumyl peroxide and t-butylcumyl peroxide; diacyl peroxides such as dibenzoyl peroxide and disuccinic acid peroxide; peroxy esters such as t-butylperoxy acetate and t-butylperoxy benzoate; and peroxy dicarbonates such as diisopropyl peroxydicarbonate. In particular, peroxyketals, hydroperoxides, dialkyl peroxides, and peroxyesters having a relatively high decomposition temperature are preferred in view of easy handling and shelf stability. These organic peroxides may be diluted with a proper organic solvent, hydrocarbon, liquid paraffin or inert solid. The amount of component (g) is 0.01 to 10 parts by mass, preferably 0.1 to 5 parts by mass, per 100 parts by mass of component (a). If the amount is less than the aforesaid lower limit, curing of the composition may not satisfactory proceed. If the amount is more than the aforesaid upper limit, a molded product may be fragile to give worse handling property, and much decomposition residues generated may damage reliability.

[Preparation of the Silicone Adhesive Composition]

The afore-mentioned silicone adhesive composition may be prepared by mixing the components (a) to (f) or components (a), (c), (f), and (g) in a mixer. The silicone adhesive composition (that is, coating liquid) may be diluted with a solvent such as xylene or toluene, as needed. The silicone adhesive composition (coating liquid) preferably has a viscosity at 25° C. of from 200 to 900 mPa·s, more preferably from 300 to 700 mPa·s, further preferably from 400 to 600 mPa·s. If the viscosity is less than the aforesaid lower limit, dripping of the coating liquid may cause in a coater machine, so that the thickness of the adhesive layer may vary. If the viscosity is higher than the aforesaid upper limit, the coating liquid may contain voids and, therefore, a silicone adhesive layer may have larger thermal resistance or poor appearance. It is noted that the viscosity of the silicone adhesive composition in the present invention is an absolute viscosity at 25° C. determined by a rotational viscometer.

In the silicone rubber sheet of the present invention, the silicone adhesive layer preferably has a thickness of from 2 to 40 μm, preferably from 5 to 30 μm. If the thickness is less than the aforesaid lower limit, a desired adhesive strength is not attained in an actual machine. If the thickness is larger than the aforesaid upper limit, the thermal resistance may be too large, and the adhesive strength is excessive, leading to worse reworkability.

The silicone adhesive layer preferably has the following adhesive strength. The adhesive strength is determined according to the Japanese Industrial Standards (JIS) C 2107:2011. Specifically, the thermally conductive silicone rubber sheet having the silicone adhesive layer is cut in a width of 25 mm. Its silicon adhesive layer side is placed on an SUS plate having a 10-mm thickness and pressed by 5 reciprocating motions of a 2-kg roller and is left to stand at 25° C. for 30 minutes. Then, the thermally conductive silicone rubber sheet is peeled by 200 mm from the plate at a pulling rate of 300 mm/min with a constant-rate tensile strength machine, whereby a stress (adhesive strength) is determined. The adhesive strength is preferably from 0.05 to 1.0 (N/25 mm), more preferably from 0.1 to 0.5 (N/25 mm). If the adhesive strength is less than the aforesaid lower limit, the adhesive strength is insufficient so that it difficult to attach the sheet to a desired implementation position. On the other hand, if the adhesive strength is larger than the aforesaid upper limit, the reworkability on an actual machine may be insufficient.

[Preparation of the Thermally Conductive Silicone Rubber Composition]

The organopolysiloxane and the thermally conductive filler are kneaded by a mixer such as kneader, Banbury mixer, planetary mixer or Shinagawa mixer, if necessary, with heating to a temperature of about 100° C. or higher. Reinforcing silica such as fumed silica or precipitated silica; silicone oil or silicone wetter; and a flame retardant such as platinum, titanium oxide, or benzotriazole may be added and mixed in the kneading step if desired, as long as the thermal conduction property is not detracted.

The uniform mixture obtained in the kneading step is cooled to room temperature, and filtrated through a strainer or the like. Then, a required amount of a curing agent is added and the resulting mixture is kneaded with twin rolls or Shinagawa mixer again. In this second kneading step, an acetylene type addition reaction controlling agent such as 1-ethynyl-1-cyclohexanol, a colorant such as organic pigment or inorganic pigment, a heat resistance improver such as iron oxide or cerium oxide, and an internal release agent may be added and mixed, if desired. The composition obtained by this second kneading step may be provided directly to a subsequent step as a coating material. If needed, a solvent such as toluene may be further added to the composition obtained and, mixed by a stirrer such as planetary mixer or kneader to obtain a coating material (thermally conductive silicone rubber composition).

[Method for Preparing the Thermally Conductive Silicone Rubber Layer]

The thermally conductive silicone rubber layer of the present invention preferably comprises a glass fiber cloth or polyimide as an intermediate reinforcing layer, as described above. Such a thermally conductive silicone rubber layer is prepared, for example, according to the method described below. When no intermediate reinforcing layer is comprised, only the thermally conductive silicone rubber composition may be heated and cured in a form of sheet.

[Method for Preparing the Glass Fiber Cloth Filled with the Thermally Conductive Silicone Rubber Composition]

The thermally conductive silicone rubber composition (coating material) obtained by the aforesaid step is applied to a glass fiber cloth. For instance, the composition is applied continuously to the glass fiber cloth by a coating apparatus, such as comma coater, knife coater, or kiss coater equipped successively with a drying furnace, a heating furnace and a rolling-up device and, then, the solvent is evaporated. Then, in the case of the addition curable composition, the resulting glass fiber cloth is heated to from 80 to 200° C., preferably from 100 to 150° C., for 5 to 20 minutes to obtain a glass fiber cloth filled with the thermally conductive silicone rubber composition. In the case of the peroxide curable composition, the resulting glass fiber cloth is heated to from 100 to 200° C., preferably from 110 to 180° C., for 2 to 15 minutes to obtain a glass fiber cloth filled with the thermally conductive silicone rubber composition.

The thermally conductive silicone rubber composition (coating material) is applied on a side (surface) of the glass fiber cloth filled with the thermally conductive silicone resin obtained in the aforesaid step. For example, the thermally conductive silicone rubber composition is applied continuously on a side (surface) of the filled glass fiber cloth by a coating apparatus such as comma coater, knife coater, or kiss coater, equipped successively with a drying furnace, a heating furnace, and a rolling-up device. Then, the solvent is evaporated. In the case of the addition curable coating material, the resulting glass fiber cloth is heated to from 80 to 200° C., preferably from 100 to 150° C., for 5 to 20 minutes to obtain a glass fiber cloth layered with the thermally conductive silicone rubber layer. In the case of the peroxide curable coating material, the resulting glass fiber cloth is heated to from 100 to 200° C., preferably from 110 to 180° C., for 2 to 15 minutes to obtain a glass fiber cloth layered with the thermally conductive silicone rubber layer. In such a manner, a high-hard, thermally conductive silicone rubber layer having the glass fiber cloth is obtained.

Further, the thermally conductive silicone rubber composition may be applied in the same manner on the other side (back surface) of the filled glass fiber cloth obtained by the aforesaid step to provide a high-hard, thermally conductive silicone rubber layer. The compositions of the high-hard, thermally conductive silicone rubber layer on the surface and the back surface may be same as or different from each other.

[Preparation of the Thermally Conductive Silicone Rubber Sheet]

The aforesaid silicone adhesive composition (coating liquid) is applied on at least one of the surfaces of the afore-mentioned high-hard, thermally conductive silicone rubber layer, and cured to obtain a thermally conductive silicone rubber sheet of the present invention. The application and curing steps may be conducted in accordance with any conventional method. For example, a thermally conductive silicone rubber sheet may be obtained by continuously applying the afore-mentioned silicone adhesive composition (coating liquid) on at least one of the surfaces of the high-hard, thermally conductive silicone rubber layer by a coating apparatus, such as comma coater, knife coater, or kiss coater, equipped successively with a drying furnace, a heating furnace, and a rolling-up device; evaporating the solvent; and heating to cure the resulting layer at 80 to 180° C., preferably at 100 to 150° C., for 2 to 20 minutes.

The thermally conductive silicone rubber sheet may further be provided with a protective sheet on the open surface of the silicone adhesive layer and may be rolled. The protective sheet may be, for example, a PET film or release paper.

EXAMPLES

The present invention will be explained below in further detail with reference to a series of the Examples and the Comparative Examples, though the present invention is in no way limited by these Examples.

[High-Hard, Thermally Conductive Silicone Rubber Layer]

The components used in Examples and Comparative Examples are as follows.

Dimethylpolysiloxane having both terminals capped with a dimethylvinyl group (average polymerization degree: 8000)

Organic peroxide: (2-methylbenzoyl) peroxide

Thermally conductive filler:

(z-1) Crushed alumina (average particle diameter: 1 μm)

(z-2) Spherical alumina (average particle diameter: 10 μm)

(z-3) Crushed boron nitride (average particle diameter: 15 μm)

Surface treatment agent: Dimethylpolysiloxane represented by the following formula (4) and having one terminal capped with a trimethoxysilyl group

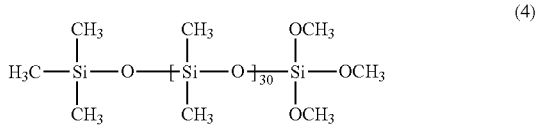 [SMILES: CO[Si](OC)(OC)O[Si](C)(C)O[Si](C)(C)C]

(4)

Plasticizer: Dimethylpolysiloxane represented by the following formula (5):

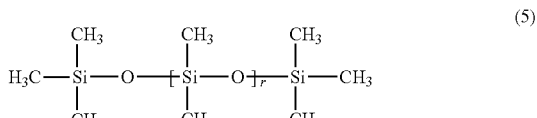

(5)

wherein r is 300.

The aforesaid components were placed in a Bunbury mixer in the compositions described in the following Table 1 and kneaded for 20 minutes to obtain thermally conductive silicone rubber compositions 1 to 6.

TABLE 1

| Parts by mass | | Thermally conductive silicone rubber composition | | | | | |
|---|---|---|---|---|---|---|---|
| | | 1 | 2 | 3 | 4 | 5 | 6 |
| Vinyl group-containing dimethylpolysiloxane | | 100 | 100 | 100 | 100 | 100 | 100 |
| Organic peroxide | | 3 | 3 | 3 | 3 | 3 | 3 |
| Thermally conductive filler | Crushed alumina | 500 | 500 | 500 | 700 | 700 | 700 |
| | Spherical alumina | 1500 | 1500 | 1500 | | | |
| | Crushed boron nitride | | | | 1000 | 1000 | 1000 |
| Total of the thermally conductive fillers | | 2000 | 2000 | 2000 | 1700 | 1700 | 1700 |
| Surface treatment agent | | 50 | 50 | 50 | 75 | 75 | 75 |
| Plasticizer | | 15 | 15 | 15 | 15 | 15 | 15 |

A glass cloth having a thickness of 38 μm and weight of 24 g/m² was coated with the thermally conductive silicone rubber composition according to the following method.

Toluene was added to the thermally conductive silicone rubber composition in a content of 22 wt % and kneaded in a planetary mixer to obtain a thermally conductive silicone coating material. The resulting thermally conductive silicone coating material was applied onto the glass fiber cloth by a comma coater. The comma coater used had a width of 1300 mm and an effective oven length of 15 m. The 15-m oven was divided into three 5-m zones to make it possible to control a temperature of each zone. The temperature was set at 80° C., 150° C., and 170° C. in the side closest to the comma part to the far side, respectively. The coating speed was set at 1.5 m/min. In this way, the thermally conductive silicone coating material was applied continuously on the glass fiber cloth and then the cloth was rolled up to obtain the glass fiber cloth filled with the thermally conductive silicone resin. The glass fiber cloth thus filled had a thickness of 80 μm.

Besides, toluene was added to the thermally conductive silicone rubber composition having the same composition as that used for filling of the glass fiber cloth in a content of 15 wt % and kneaded by a planetary mixer to prepare a coating liquid. The resulting coating liquid was applied onto one of the surfaces of the filled glass fiber cloth by the comma coater, followed by rolled-up. Then, the coating liquid was similarly applied onto the other surface of the filled glass fiber cloth, followed by rolled-up to obtain a high-hard, thermally conductive silicone rubber layer having a total thickness of 200 μm. The application was conducted by the same comma coater in the same conditions as in the filling step.

Evaluation of the Thermally Conductive Silicone Rubber Layer (1) Determination of Hardness Each of the thermally conductive silicone rubber compositions 1 to 6 was cured in curing conditions of 140° C. for 10 minutes to a form sheet having a thickness of 6 mm. Two sheets were put on one another and the hardness of the sheet was determined by a Type A durometer hardness tester. The results are as shown in Tables 2 and 3. The thermally conductive silicone rubber layers had no tackiness and their adhesive strength was below the detection limit.

(2) Thermal Conductivity

Each of the thermally conductive silicone rubber compositions 1 to 6 was cured in curing conditions of 140° C. for 10 minutes to obtain a sheet-like thermally conductive silicone rubber layer having a thickness of 6 mm. The thermal conductivity of the thermally conductive silicone rubber layer was determined by a thermal conductivity meter (TPA-501, ex Kyoto Electronics Manufacturing Co., Ltd.). The results are as shown in Tables 2 and 3.

[Silicone Adhesive Composition]

The components used in the preparation of a silicone adhesive composition are as follows.

In the following description, the phenyl-group content (%) is a percentage of the number of the phenyl groups each bonded to a silicon atom, based on the total number of the substituents each bonded to a silicon atom. The viscosity of the organopolysiloxane is a kinematic viscosity at 25° C. as determined by an Ostwald viscometer. The average particle diameter is a volume-average particle diameter determined by a Microtrac MT3300EX, ex Nikkiso Co., Ltd.

(a) Alkenyl group-containing organopolysiloxane
  (a-1) Organopolysiloxane having a vinyl group and containing 5% of a phenyl group (5000 mm²/s)
  (a-2) Organopolysiloxane having a vinyl group and containing 20% of a phenyl group (2000 mm²/s)
  (a-3) Organopolysiloxane having a vinyl group and containing 0.5% of a phenyl group (8000 mm²/s), for comparison
  (a-4) Organopolysiloxane having a vinyl group and containing 30% of a phenyl group (1600 mm²/s), for comparison
(b) Organohydrogenpolysiloxane represented by the following formula (1500 mPa·s)

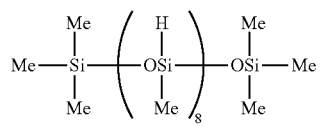

(c) Thermally conductive filler
  (c-1) Amorphous alumina (average particle diameter: 1 μm, particles having a particle diameter of 20 μm or more: 3 mass % or less, particles having a particle diameter of 40 μm or more: 0%)

(c-2) Amorphous aluminum nitride (average particle diameter: 5 μm, particles having a particle diameter of 20 μm or more: 3 mass % or less, particles having a particle diameter of 40 μm or more: 0%)

(c-3) Crushed zinc oxide (average particle diameter: 2 μm, particles having a particle diameter of 20 μm or more: 3% or less, particles having a particle diameter of 40 μm or more: 0%)

(c-4) Amorphous alumina (average particle diameter: 1 μm, particles having a particle diameter of 20 μm or more: 10 mass %, particles having a particle diameter of 40 μm or more: 3 mass %), for comparison (c-5) Amorphous alumina (average particle diameter: 15 μm, particles having a particle diameter of 20 μm or more: 3% or less, particles having a particle diameter of 40 μm or more: 0%), for comparison (d) Addition reaction catalyst: a 5% solution of chloroplatinic acid in 2-ethylhexanol (e) Addition reaction controlling agent: ethynylmethylidenecarbinol (f) Silicone resin: A solution of a silicone resin composed of $(CH_3)_3SiO_{1/2}$ units and $SiO_{4/2}$ units in xylene, wherein a ratio of the number of $(CH_3)_3SiO_{1/2}$ units to the number of $SiO_{4/2}$ units is 1.15 (nonvolatile content: 60%, M/Q, molar ratio=1.15)

(g) Organic peroxide: 1,1-di(t-butylperoxy)cyclohexane

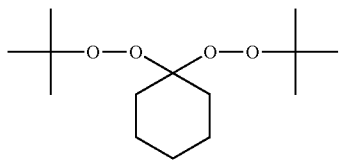 [SMILES: CC(C)(C)OOC1(OOC(C)(C)C)CCCCC1]

Examples 1 to 5 and Comparative Examples 1 to 6

Components (a), (c), (d), and (f) were placed in a Shinagawa-type universal stirrer in the compositions described in Tables 2 and 3, and mixed for 30 minutes. Then, component (e) was added and uniformly mixed. Then, component (b) was added to the mixture and uniformly mixed to prepare an addition curable silicone adhesive composition having a viscosity of 500 mPa·s.

Example 6

Components (a), (c), and (f) were placed in a Shinagawa-type universal stirrer in the composition described in Table 2 and mixed for 30 minutes. Then, component (g) was added and mixed uniformly to prepare a peroxide curable silicone adhesive composition having a viscosity of 400 mPa·s.

The afore-mentioned viscosity of the silicone adhesive composition is an absolute viscosity at 25° C. as determined by a rotational viscometer. The "part by mass" of the silicone resin described in Tables 2 and 3 means the resin content in the xylene solution.

The silicone adhesive composition (coating liquid) was applied on one side of the high-hard thermally conductive silicone rubber layer which was obtained above, by the comma coater described above. The drying zones were set at 80° C., 120° C., and 140° C. in the side closest to the comma part to the far side, respectively and the coating speed was set at 4 m/min. In this way, the silicone adhesive composition was continuously applied on the high-hard thermally conductive silicone rubber layer and then cured to form a silicone adhesive layer.

Then, the surface of the silicone adhesive layer was covered with a silicone-treated release PET film, commercially available protective film, and the layer was rolled to obtain a high-hard, thermally conductive silicone rubber sheet in a form of roll. It is noted that the thickness of the silicone adhesive layer may be adjusted as desired by adjusting the gap at the head part of the comma coater.

[Evaluation Method]

The thermally conductive silicone rubber sheets thus obtained were evaluated in the following methods. The results are shown in Tables 2 and 3.

(1) Thickness of the Adhesive Layer

The overall thickness of the thermally conductive silicone rubber sheet including the silicone adhesive layer, but excluding the thickness of the protective film was determined by a microgauge. The thickness of the thermally conductive silicone rubber layer (200 μm) was subtracted from the overall thickness to obtain the thickness of the silicone adhesive layer.

(2) Adhesive Strength

In accordance with the Japanese Industrial Standards (JIS) C 2107:2011, the adhesive layer side of the thermally conductive silicone rubber sheet (width: 25 mm) from which the protective film was peeled off was attached to a stainless steel plate (SUS plate) and left to stand at 25° C. for 30 min. Then, a 180° peel test was conducted to determine a force (release force) required for peeling the silicone adhesive layer by 200 mm from the stainless steel plate at a direction of 180° at a rate of 300 mm/min. The resulting release force is designated as an initial adhesive strength of the silicone adhesive layer and shown in Tables 2 and 3.

(3) Stability of the Adhesive Layer with Time

A protective film was attached to the surface of the adhesive layer of the thermally conductive silicone rubber sheet and, then, the sheet was aged at 60° C. for 2 months. Then, the protective film was peeled off and the release force was determined in the same manner as mentioned in Adhesive strength (2) above. The release force is shown in Tables 2 and 3 as an adhesive strength after the storage at 60° C. for 2 months.

(4) Reworkability

After the Adhesive strength (2) above, it was observed whether a portion of the adhesive having a diameter of 1 mm or more remained on the SUS plate or not. When no adhesive remained, the sheet was evaluated as having good reworkability (G). When portion of the adhesive remained, the sheet was evaluated as having poor reworkability (P). The results are shown in Tables 2 and 3. For the thermally conductive silicone rubber sheet of Comparative Example 4, a portion of the adhesive having a diameter of 1 mm or more was observed, so that it was impossible to precisely determine the adhesive strength.

(5) Thermal Resistance

The thermal resistance of the thermally conductive silicone rubber sheet was determined by the method according to ASTM D5470. In addition, the thermally conductive silicone rubber sheet was stored at 60° C. for 2 months and, then, the thermal resistance thereof was determined according to ASTM D5470.

TABLE 2

|  | Part by mass | Example 1 | 2 | 3 | 4 | 5 | 6 |
|---|---|---|---|---|---|---|---|
| Thermally conductive silicone rubber layer | Thermally conductive silicone rubber composition | 1 | 2 | 3 | 4 | 5 | 6 |
|  | Hardness of thermally conductive silicone rubber layer, Type A durometer | 90 | 90 | 90 | 90 | 90 | 90 |
|  | Thermal conductivity, W/m·K | 2.85 | 2.85 | 2.85 | 5.2 | 5.2 | 5.2 |
| Silicone adhesive composition | (a) Alkenyl group-containing organopolysiloxane, Ph content of 5% | 100 | 100 | 100 | 100 | 100 | |
|  | Alkenyl group-containing organopolysiloxane, Ph content of 20% | | | | | | 100 |
|  | (b) Organohydrogen polysiloxane | 1.6 | 1.6 | 1.6 | 1.6 | 1.6 | |
|  | (c) (c-1) Amorphous alumina | 350 | | 120 | | | 400 |
|  | (c-2) Amorphous aluminum nitride | | 200 | 20 | 450 | | |
|  | (c-3) Crushed zinc oxide | | | | | 250 | 100 |
|  | (d) Addition reaction catalyst | 0.6 | 0.6 | 0.6 | 0.6 | 0.6 | |
|  | (e) Addition reaction controlling agent | 0.2 | 0.2 | 0.2 | 0.2 | 0.2 | |
|  | (f) Silicone resin | 100 | 100 | 150 | 150 | 250 | 250 |
|  | (g) Organic peroxide | | | | | | 1.5 |
|  | A ratio of the number of SiH to the number of SiVi | 2.4 | 2.4 | 2.4 | 2.4 | 2.4 | |
| Evaluation | Thickness of the adhesive layer, μm | 5 | 10 | 10 | 15 | 10 | 20 |
|  | Thermal resistance, $cm^2$·K/W, @100 psi | 1.8 | 2.2 | 2.3 | 1.9 | 1.6 | 2.1 |
|  | Thermal resistance after stored at 60° C. for 2 months, $cm^2$·K/W, @100 psi | 1.7 | 2.2 | 2.2 | 1.8 | 1.6 | 2.1 |
|  | Reworkability | G | G | G | G | G | G |
|  | Initial adhesive strength, N/25 mm | 0.2 | 0.24 | 0.34 | 0.38 | 0.44 | 0.37 |
|  | Adhesive strength after stored at 60° C. for 2 months, N/25 mm | 0.2 | 0.23 | 0.35 | 0.37 | 0.44 | 0.32 |

|  | Part by mass | Comparative Example 1 | 2 | 3 | 4 | 5 | 6 |
|---|---|---|---|---|---|---|---|
| Thermally conductive silicone rubber layer | Thermally conductive silicone rubber composition | 1 | 2 | 3 | 4 | 5 | 6 |
|  | Hardness of thermally conductive silicone rubber layer, Type A durometer | 90 | 90 | 90 | 90 | 90 | 90 |
|  | Thermal conductivity, W/m·K | 2.85 | 2.85 | 2.85 | 5.2 | 5.2 | 5.2 |
| Silicone adhesive composition | (a) Alkenyl group-containing organopolysiloxane, Ph content of 5 mol % | | | | 100 | 100 | 100 | 100 |
|  | Alkenyl group-containing organopolysiloxane, Ph content of 0.5 mol % | 100 | | | | | |
|  | Alkenyl group-containing organopolysiloxane, Ph content of 30 mol % | | | 100 | | | |
|  | (b) Organohydrogen polysiloxane | 1.6 | 1.6 | 1.6 | 1.6 | 1.6 | 1.6 |
|  | (c) (c-1) Amorphous alumina | 350 | 350 | | | 500 | 500 |
|  | (c-4) Amorphous alumina *1 | | | 300 | | | |
|  | (c-5) Amorphous alumina *2 | | | | 250 | | |
|  | (d) Addition reaction catalyst | 0.6 | 0.6 | 0.6 | 0.6 | 0.6 | 0.6 |
|  | (e) Addition reaction controlling agent | 0.2 | 0.2 | 0.2 | 0.2 | 0.2 | 0.2 |
|  | (f) Silicone resin | 100 | 150 | 250 | 250 | 30 | 450 |
|  | A ratio of the number of SiH to the number of SiVi | 2.4 | 2.4 | 2.4 | 2.4 | 2.4 | 2.4 |
| Evaluation | Thickness of the adhesive layer, μm | 10 | 10 | 15 | 15 | 15 | 15 |
|  | Thermal resistance, $cm^2$·K/W, @100 psi | 2.3 | 2.3 | 2.6 | 1.9 | 2.1 | 2.1 |
|  | Thermal resistance after stored at 60° C. for 2 months, $cm^2$·K/W, @100 psi | 2.2 | 2.2 | 2.6 | 1.9 | 2.0 | 2.0 |
|  | Reworkability | G | G | G | P | G | P |

-continued

| | Comparative Example | | | | | |
|---|---|---|---|---|---|---|
| Part by mass | 1 | 2 | 3 | 4 | 5 | 6 |
| Initial adhesive strength, N/25 mm | 0.28 | 0.04 | 0.03 | ND | 0.04 | 1.4 |
| Adhesive strength after stored at 60° C. for 2 months, N/25 mm | 0.08 | 0.04 | 0.02 | ND | 0.03 | 1.2 |

[1] Average particle diameter: 1 μm, amount of particles having a particle diameter of 20 μm or more: 10 mass %, amount of particles having a particle diameter of 40 μm or more: 3 mass %
[2] Average particle diameter: 15 μm, amount of particles having a particle diameter of 20 μm or more: 3% or less, amount of particles having a particle diameter of 40 μm or more: 0%

As seen in Table 2, in Comparative Example 1, the phenyl group content of the alkenyl group-containing organopolysiloxane in the silicone adhesive layer was too small, so that the adhesive strength decreased with time. In Comparative Example 2, the phenyl group content of the alkenyl group-containing organopolysiloxane in the silicone adhesive layer was too large, so that a desired adhesive strength was not attained. In Comparative Example 3, the thermally conductive filler in the silicone adhesive composition contained 3 mass % or more of particles having a particle diameter of 20 μm or more and 0.01 mass % or more of particles having a particle diameter of 40 μm or more and, therefore, the adhesive layer had a rough surface and a desired adhesive strength was not attained. In Comparative Example 4, the thermally conductive filler in the silicone adhesive composition had an average particle diameter of 10 μm or more, so that the adhesive layer had a rough surface, reworkability was poor and an adhesive strength could not be determined. The composition of Comparative Example 5 had a too small silicone resin content, so that the cohesion strength was poor and the adhesive strength was bad. The composition of Comparative Example 6 had a too large silicone resin content, so that the adhesive strength was too large and the reworkability was bad.

In contrast, as seen in Table 2, the thermally conductive silicone rubber sheets of the present invention did not cause a marked increase in thermal resistance with time even after stored, were excellent in reworkability, and did not cause a change in adhesive strength with time and, therefore, were excellent in reliability.

INDUSTRIAL APPLICABILITY

The thermally conductive silicone rubber sheet of the present invention is excellent in workability and thermal conductivity, shows a less change in adhesive strength with time, is excellent in reworkability, and shows a less thermal resistance. Further, the thermally conductive silicone rubber sheet of the present invention may be prepared by a more convenience process than the conventional layering method using a primer.

The invention claimed is:
1. A thermally conductive silicone rubber sheet comprising at least one thermally conductive silicone rubber layer having a type A durometer hardness of 60 to 96 and at least one silicone adhesive layer, wherein
the silicone adhesive layer is a cured product of an addition curable or peroxide curable silicone adhesive composition comprising the following components (a), (c) and (f):
100 parts by mass of (a) organopolysiloxane having at least one alkenyl group bonded to a silicon atom and having a phenyl group bonded to a silicon atom in such an amount that the percentage of the number of the phenyl group is 2 to 20%, based on the total number of groups each bonded to a silicon atom selected from a phenyl group, an alkenyl group, and other organic groups other than the alkenyl group and the phenyl group,
100 to 800 parts by mass of (c) thermally conductive filler having an average particle diameter of less than 10 μm and containing 0 to 3 mass % of particles having a particle diameter of 20 μm or more and 0 to 0.01 mass % of particles having a particle diameter of 40 μm or more, and
50 to 300 parts by mass of (f) silicone resin comprising an $R_3SiO_{1/2}$ unit and an $SiO_{4/2}$ unit, wherein R is an unsubstituted or substituted monovalent hydrocarbon group having from 1 to 10 carbon atoms and no aliphatic unsaturated bond, and a ratio of the number of the $R_3SiO_{1/2}$ unit to the number of the $SiO_{4/2}$ unit is 0.5 to 2.5.

2. The thermally conductive silicone rubber sheet according to claim 1, wherein the silicone adhesive composition is addition curable and further comprises the following components (b), (d) and (e):
(b) organohydrogenpolysiloxane in such an amount that a ratio of the number of the hydrogen atom bonded to a silicon atom in component (b) to the number of the alkenyl group in component (a) is 0.5 to 30,
a catalytic amount of (d) addition reaction catalyst, and
0.01 to 1 part by mass of (e) addition reaction controlling agent.

3. The thermally conductive silicone rubber sheet according to claim 1, wherein the silicone adhesive composition is peroxide curable and further comprises 0.01 to 10 parts by mass of (g) organic peroxide, relative to 100 parts by mass of component (a).

4. The thermally conductive silicone rubber sheet according to claim 1, wherein the thermally conductive filler is at least one selected from alumina, aluminum hydroxide, aluminum nitride, boron nitride, zinc oxide and metal aluminum.

5. The thermally conductive silicone rubber sheet according to claim 1, wherein the thermally conductive silicone rubber layer has an adhesive strength of 0.01 N/25 m or less and the silicone adhesive layer is layered on one surface of the thermally conductive silicone rubber layer.

6. The thermally conductive silicone rubber sheet according to claim 1, wherein the silicone adhesive layer has a thickness of 2 to 40 μm.

7. The thermally conductive silicone rubber sheet according to claim 1, wherein the thermally conductive silicone rubber layer has a thickness of 50 to 900 μm.

8. The thermally conductive silicone rubber sheet according to claim 1, wherein the thermally conductive silicone rubber layer is a cured product of an addition curable, thermally conductive silicone rubber composition comprising an alkenyl group-containing organopolysiloxane, an organohydrogenpolysiloxane, an addition reaction catalyst, a thermally conductive filler, and a surface treatment agent.

9. The thermally conductive silicone rubber sheet according to claim 1, wherein the thermally conductive silicone rubber layer is a cured product of a peroxide curable, thermally conductive silicone rubber composition comprising an alkenyl group-containing organopolysiloxane, an organic peroxide, a thermally conductive filler, and a surface treatment agent.

10. The thermally conductive silicone rubber sheet according to claim 1, wherein the thermally conductive silicone rubber layer has a thermal conductivity of 1.0 W/m·K or larger.

11. The thermally conductive silicone rubber sheet according to claim 1, being in a form of roll, wherein a protective sheet is provided on the surface of the silicone adhesive layer which surface is not in contact with the thermally conductive silicone rubber layer.

12. A method for preparing the thermally conductive silicone rubber sheet according to claim 1, wherein the method comprises steps of applying the silicone adhesive composition on at least one surface of the thermally conductive silicone rubber layer and heat-curing the silicone adhesive composition to obtain the thermally conductive silicone rubber sheet.

13. The thermally conductive silicone rubber sheet according to claim 2, wherein the thermally conductive filler is at least one selected from alumina, aluminum hydroxide, aluminum nitride, boron nitride, zinc oxide and metal aluminum.

14. The thermally conductive silicone rubber sheet according to claim 3, wherein the thermally conductive filler is at least one selected from alumina, aluminum hydroxide, aluminum nitride, boron nitride, zinc oxide and metal aluminum.

15. The thermally conductive silicone rubber sheet according to claim 2, wherein the thermally conductive silicone rubber layer has an adhesive strength of 0.01 N/25 m or less and the silicone adhesive layer is layered on one surface of the thermally conductive silicone rubber layer.

16. The thermally conductive silicone rubber sheet according to claim 3, wherein the thermally conductive silicone rubber layer has an adhesive strength of 0.01 N/25 m or less and the silicone adhesive layer is layered on one surface of the thermally conductive silicone rubber layer.

17. The thermally conductive silicone rubber sheet according to claim 4, wherein the thermally conductive silicone rubber layer has an adhesive strength of 0.01 N/25 m or less and the silicone adhesive layer is layered on one surface of the thermally conductive silicone rubber layer.

18. The thermally conductive silicone rubber sheet according to claim 2, wherein the silicone adhesive layer has a thickness of 2 to 40 μm.

19. The thermally conductive silicone rubber sheet according to claim 3, wherein the silicone adhesive layer has a thickness of 2 to 40 μm.

20. The thermally conductive silicone rubber sheet according to claim 4, wherein the silicone adhesive layer has a thickness of 2 to 40 μm.

* * * * *

UNITED STATES PATENT AND TRADEMARK OFFICE
CERTIFICATE OF CORRECTION

| | | |
|---|---|---|
| PATENT NO. | : 12,286,568 B2 | Page 1 of 2 |
| APPLICATION NO. | : 17/428316 | |
| DATED | : April 29, 2025 | |
| INVENTOR(S) | : Ito et al. | |

It is certified that error appears in the above-identified patent and that said Letters Patent is hereby corrected as shown below:

In the Specification

Columns 23-24, Table 3: Please delete and replace with the following:

Signed and Sealed this
Thirtieth Day of September, 2025

John A. Squires
*Director of the United States Patent and Trademark Office*

[Table 3]

| | Part by mass | Comparative Example | | | | | |
|---|---|---|---|---|---|---|---|
| | | 1 | 2 | 3 | 4 | 5 | 6 |
| Thermally conductive silicone rubber layer | Thermally conductive silicone rubber composition | 1 | 2 | 3 | 4 | 5 | 6 |
| | Hardness of thermally conductive silicone rubber layer, Type A durometer | 90 | 90 | 90 | 90 | 90 | 90 |
| | Thermal conductivity, W/m·K | 2.85 | 2.85 | 2.85 | 5.2 | 5.2 | 5.2 |
| Silicone adhesive composition | (a) Alkenyl group-containing organopolysiloxane, Ph content of 5% | | | 100 | 100 | 100 | 100 |
| | (a) Alkenyl group-containing organopolysiloxane, Ph content of 0.5% | 100 | | | | | |
| | (a) Alkenyl group-containing organopolysiloxane, Ph content of 30% | | 100 | | | | |
| | (b) Organohydrogen polysiloxane | 1.6 | 1.6 | 1.6 | 1.6 | 1.6 | 1.6 |
| | (c) (c-1) Amorphous alumina | 350 | 350 | | | 500 | 500 |
| | (c) (c-4) Amorphous alumina *1 | | | 300 | | | |
| | (c) (c-5) Amorphous alumina *2 | | | | 250 | | |
| | (d) Addition reaction catalyst | 0.6 | 0.6 | 0.6 | 0.6 | 0.6 | 0.6 |
| | (e) Addition reaction controlling agent | 0.2 | 0.2 | 0.2 | 0.2 | 0.2 | 0.2 |
| | (f) Silicone resin | 100 | 150 | 250 | 250 | 30 | 450 |
| | A ratio of the number of SiH to the number of SiVi | 2.4 | 2.4 | 2.4 | 2.4 | 2.4 | 2.4 |
| Evaluation | Thickness of the adhesive layer, μm | 10 | 10 | 15 | 15 | 15 | 15 |
| | Thermal resistance, cm²·K/W, @100psi | 2.3 | 2.3 | 2.6 | 1.9 | 2.1 | 2.1 |
| | Thermal resistance after stored at 60 °C for 2 months, cm²·K/W, @100psi | 2.2 | 2.2 | 2.6 | 1.9 | 2.0 | 2.0 |
| | Reworkability | G | G | G | P | G | P |
| | Initial adhesive strength, N/25mm | 0.28 | 0.04 | 0.03 | ND | 0.04 | 1.4 |
| | Adhesive strength after stored at 60 °C for 2 months, N/25mm | 0.08 | 0.04 | 0.02 | ND | 0.03 | 1.2 |